United States Patent [19]
Chen et al.

[11] Patent Number: 5,369,316
[45] Date of Patent: Nov. 29, 1994

[54] ADVANCED OUTPUT BUFFER WITH REDUCED VOLTAGE SWING AT OUTPUT TERMINAL

[75] Inventors: Wei Chen, Saratoga, Calif.; Sheau Y. Shyu, Hsin-Chu; Chen Chih-Hung, Hsintien, both of Taiwan, Prov. of China

[73] Assignee: United Microelectronics Corporation, Hsinchu, Taiwan, Prov. of China

[21] Appl. No.: 155,623

[22] Filed: Nov. 22, 1993

[51] Int. Cl.$^5$ .......................................... H03K 17/04
[52] U.S. Cl. .................................. 326/83; 327/108; 327/379
[58] Field of Search ............... 307/263, 270, 443, 473, 307/475, 549, 550, 568, 572

[56] References Cited
U.S. PATENT DOCUMENTS

| | | | |
|---|---|---|---|
| 4,926,383 | 5/1990 | Kertis et al. | 365/203 |
| 4,975,877 | 12/1990 | Bell | 365/189.1 |
| 4,983,860 | 1/1991 | Yim et al. | 307/443 |
| 4,984,208 | 1/1991 | Sawada et al. | 365/222 |
| 4,988,888 | 1/1991 | Hirose et al. | 307/443 |
| 5,057,711 | 10/1991 | Lee et al. | 307/443 |
| 5,091,889 | 2/1992 | Hamano et al. | 365/233 |
| 5,151,621 | 9/1992 | Goto | 307/475 |
| 5,311,076 | 5/1994 | Park et al. | 307/443 |

*Primary Examiner*—Timothy P. Callahan
*Assistant Examiner*—Jeffrey Zweizig
*Attorney, Agent, or Firm*—George O. Saile; Stephen B. Ackerman

[57] ABSTRACT

An advanced output buffer circuit is described which has a reduced voltage swing, in order to increase the buffer speed and to reduce electrical noise due to lower instant current flow. The reduced voltage swing is at the buffer circuit output terminal, acting in response to control signals and a data signal on its input terminals. A first inverter stage has as its input the input terminal at which is applied the data signal, and delays the data signal. A second inverter stage with its input being the input terminal at which is applied the data signal, provides an inverted data signal at its output. A blocking circuit, responsive to the control signals, blocks the data signal and the inverted data signal. A biasing circuit, also responsive to the control signals, biases a first and second output node to a first intermediate voltage level, the first and second output nodes being connected to outputs of the blocking circuit. There is also a generating circuit, with its inputs connected to the first and second output nodes, for generating a second intermediate voltage level at the output terminal in response to the first intermediate voltage level during the blocking of the data signal, wherein the generating circuit provides the data signal at the circuit output when the blocking circuit allows the data signal to pass through.

12 Claims, 4 Drawing Sheets

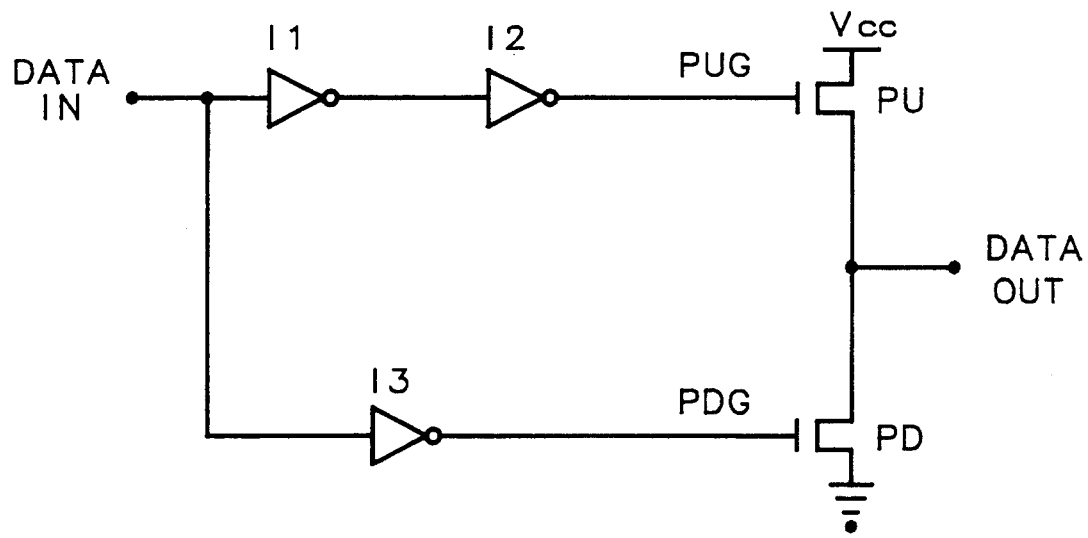
*FIG. 3 - Prior Art*
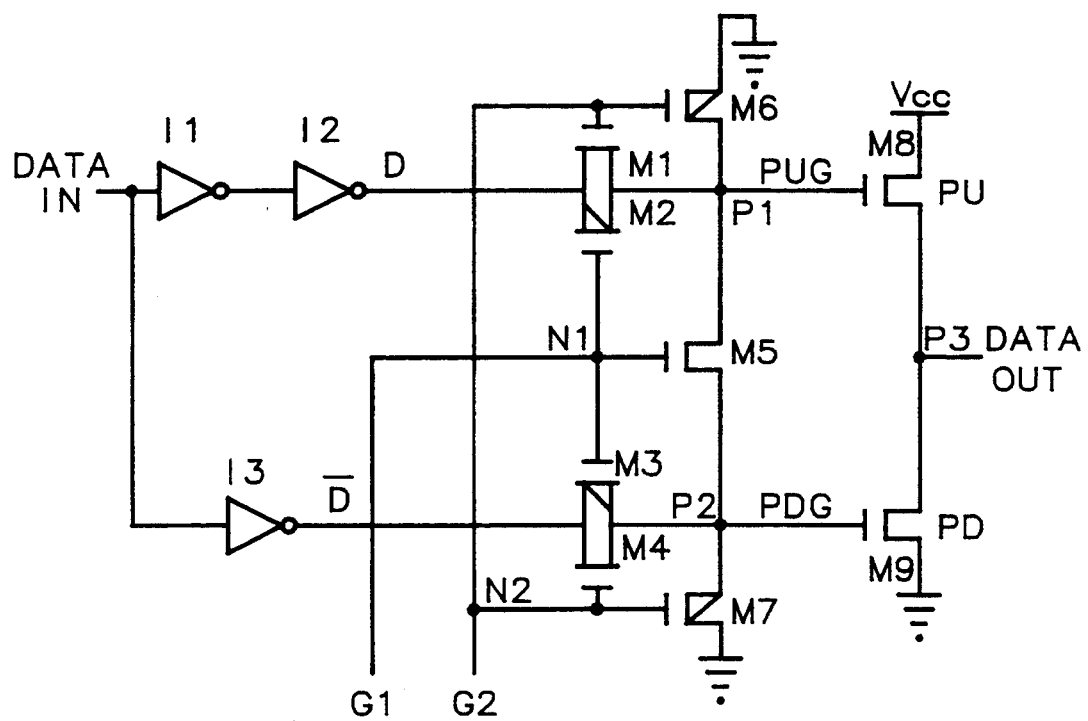
*FIG. 4*

ADVANCED OUTPUT BUFFER WITH REDUCED VOLTAGE SWING AT OUTPUT TERMINAL

BACKGROUND OF THE INVENTION

(1) Field of the Invention

The invention relates to output buffer circuits, and more particularly to an advanced output buffer for static memories in which a fast output buffer is required.

(2) Description of the Related Art

Workers in the field have made various attempts to increase the speed of static RAM (Random Access Memory) devices. Kertis et al U.S. Pat. No. 4,926,383 describes a BiCMOS static RAM (random access memory)in which a bipolar transistor is used to clamp a memory bit line to an intermediate voltage to decrease the access time of the static RAM. Bell U.S. Pat. No. 4,975,877 reduces the access time for read operations by several circuit implementations. Sawada et al U.S. Pat. No. 4,984,208 provides a control circuit for refreshing storage data within a read/write cycle, and shows an input/output circuit 55 which provides an intermediate voltage during those periods when active data is not present. Hamano et al U.S. Pat. No. 5,091,889 for a static RAM describes the use of an intermediate voltage for a bit line, in order to prevent write errors. In the latter two references, an intermediate voltage is used at a circuit output for various reasons.

SUMMARY OF THE INVENTION

The object of this invention is to provide an advanced output buffer circuit with a reduced voltage swing, in order to increase the buffer speed and to reduce electrical noise due to lower instant current flow.

This object is achieved by an output buffer circuit with a reduced voltage swing at its output terminal acting in response to control signals and a data signal on its input terminals. A first inverter stage has as its input the input terminal at which is applied the data signal, and delays the data signal. A second inverter stage with its input being the input terminal at which is applied the data signal, provides an inverted data signal at its output. There is a means, responsive to the control signals, for blocking the data signal and the inverted data signal. There is also a means, responsive to the control signals, for biasing a first and second output node to a first intermediate voltage level, the first and second output nodes being connected to outputs of the blocking means. There is also a means, with its inputs connected to the first and second output nodes, for generating a second intermediate voltage level at the output terminal in response to the first intermediate voltage level during the blocking of the data signal, wherein the generating means provides the data signal at the circuit output when the blocking means allow the data signal to pass through.

BRIEF DESCRIPTION OF THE DRAWINGS

FIG. 3 is a schematic drawing of a prior art output buffer.

FIG. 4 is a schematic drawing of the preferred embodiment of the output buffer circuit of the invention.

DESCRIPTION OF THE PREFERRED EMBODIMENTS

Figure 1:
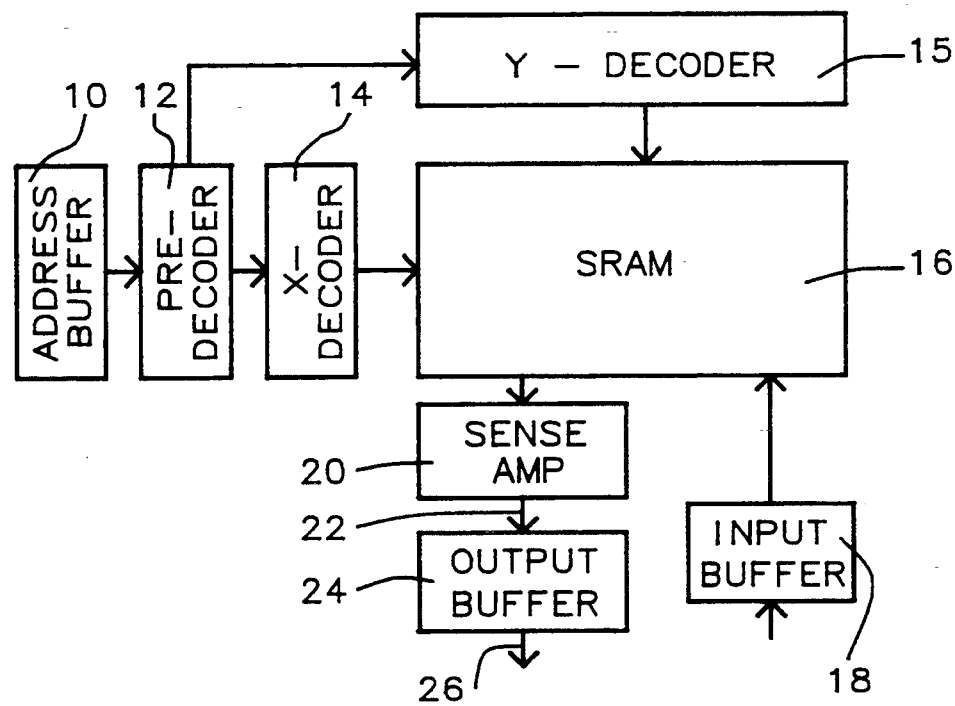
FIG. 1 is a schematic drawing of the elements of a static RAM subsystem, including an output buffer.

Referring now to FIG. 1, an application for the output buffer of the invention is shown. An output buffer is typically used to provide data at the output of a static random access memory (RAM) during a read operation. Shown in FIG. 1 are the elements of a static RAM subsystem. These elements include an address buffer 10, a pre-decoder 12 which splits data into x and y information for input to x-decoder 14 and y-decoder 15, the decoders providing address information to the static memory 16, the central element of the subsystem where data is stored. During a write operation, data is staged in the input buffer 18 and then moves directly into the static memory 16. During a read operation, data moves out of the static memory 16 to a sense amplifier 20, and then moves via the Data In line 22 to the output buffer 24, where it is staged to be read out to another system element via Data Out line 26.

Figure 2:
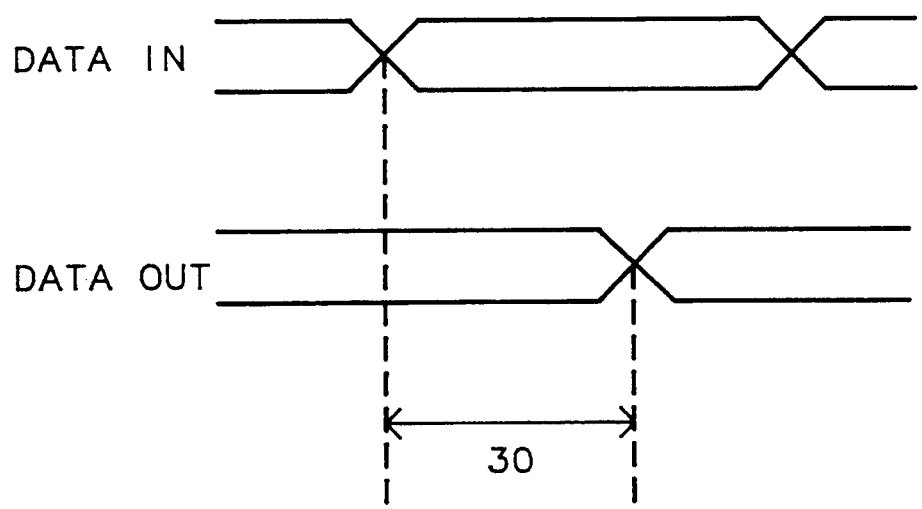
FIG. 2 shows waveforms at the input and output of the output buffer of FIG. 1.

As the speed of static RAM memory continues to be improved, further speed improvements are required from other elements of the subsystem. The key performance measurement for the output buffer 24 is the Transit Access Address time. Shown in FIG. 2 are two waveforms, representing data coming into (Data in) the output buffer and data coming out of (Data Out) the output buffer, and their timing relationship. These waveforms represent the voltage levels of the data signals, which vary between the power supply voltage $V_{cc}$, and ground, which will be referred to as "high" and "low" levels, respectively. The Transit Access Address time 30, as shown in FIG. 2, is the time from a transition of Data in at the input to the output buffer 24, to the resulting transition of Data Out at the buffer output.

Referring now to FIG. 3, a schematic drawing of a prior art output buffer circuit is shown. A Data In signal is applied at the input of the circuit, and after propagating through the output buffer circuit, the same signal is provided at the circuit output as Data Out. The inverters I1, I2 and I3 provide the Data In signal and inverted Data In signal to the next stage of the circuit where I2 provides the signal PUG and I3 provides the signal PDG, as shown in FIG. 3. As shown in FIG. 2, a transition from a low to high level for Data In will result, after the Transition Access Address time, in a transition from low to high for Data Out.

The prior art output buffer also includes pull-up device PU and pull-down device PD connected in series between a voltage terminal (providing power supply voltage $V_{cc}$) and a ground terminal. When the Data In signal is high, this circuit applies $V_{cc}$ at the output terminal through the pull-up device, NMOS transistor PU. When Data In is low, the circuit couples the output terminal to ground through the pull-down device, NMOS transistor PD, so that the Data Out signal is low.

One possibility for increasing the speed of providing the proper level at Data Out, after a transition of Data In, would be to increase the speed of the voltage swing, from low to high or from high to low. However, this would increase noise in the system, due to the increased speed with which current would flow during charging through the pull-up device PU (during a low-to-high transition) or during discharge through the pull-down device PD (during a high-to-low transition). This can be understood with reference to the equation $$dV = C(dI/dt)$$

where dV is a change in voltage (V), C is capacitance, and dI/dt is the change in current (I) with respect to time (t). When there is a rapid change in current flow (I) in a short period of time (t), the change in voltage dV is large. The voltage change dV is commonly referred to as electrical noise and must be kept as small as possible.

The invention provides an alternate method for increasing the speed of the output buffer circuit. Rather than increasing the speed of the voltage swing of the Data Out signal, the invention provides an intermediate voltage level during non-transitional periods of the output signal. Then when a transition occurs, there is a reduced voltage change required, resulting in increased speed without the current-induced noise problem.

Figure 5:
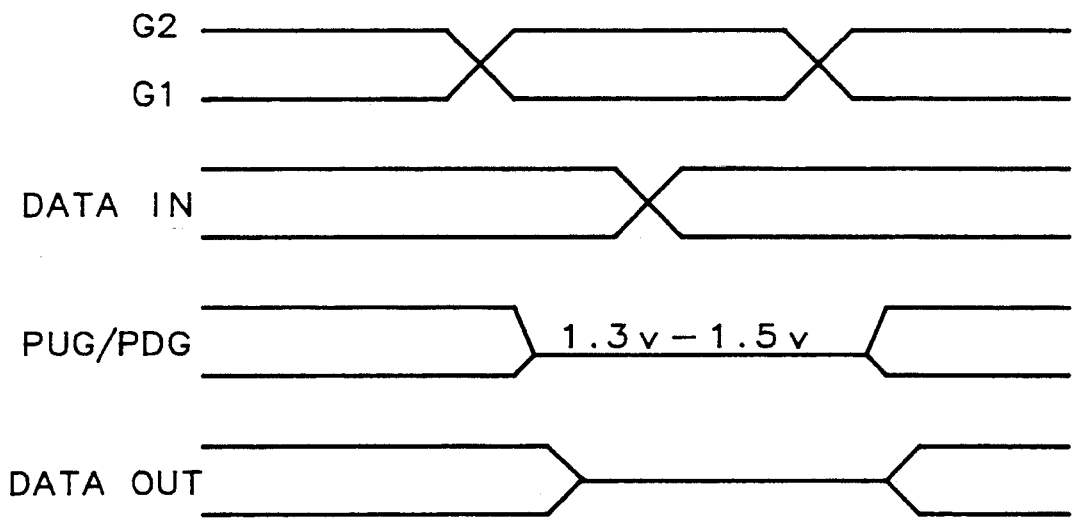
FIG. 5 shows waveforms at the three inputs, one output and two intermediate nodes of the circuit of FIG. 4 for one data cycle.

The invention can be understood with respect to FIGS. 4 and 5, which are a schematic drawing of the output buffer circuit of the invention, and associated waveforms at various nodes of the circuit, respectively. The general operation of the circuit is that the control signals G1, G2 temporarily block D and $\overline{D}$ by turning off CMOS switches M1, M2 and M3, M4. The three transistors M5, M6, M7 operate together to provide an intermediate voltage at nodes P1, P2. This causes the pullup/pulldown transistors M8, M9 to also output an intermediate voltage. The control signals then switch to pass through the data to the output, where a reduced voltage swing occurs. The operation is discussed in more detail, as follows.

Data coming from the static RAM is shown at the input to the output buffer circuit as the signal Data In. This signal is either at a high or low level. A first inverter stage consists of inverters I1 and I2, in which the I1 input is connected to the input terminal of the circuit, I1 and I2 are connected in series, and the output of I2 provides the data signal D to the first blocking CMOS M1,M2. The purpose of this inverter stage is as a buffer. A second inverter stage consists simply of inverter I3, which also has its input connected to the input terminal, and provides the signal $\overline{D}$ at its output to second blocking CMOS M3,M4.

The blocking CMOS M1,M2 and M3,M4 provide a means, responsive to the control signals, for blocking the data signal D and the inverted data signal $\overline{D}$ from propagating through to the output while the rest of the circuit is setting the intermediate voltage level of Data Out. The circuit input to which the G1 control signal is applied is node N1 in FIG. 4. This node connects the gates of the CMOS P-channel devices M2 and M3, as well as to the gate of NMOS M5. The G2 control signal is connected to node N2, and to the gates of the CMOS N-channel devices M1 and M4, and to the gates of PMOS M6 and M7.

As can be seen from FIG. 5, the control signals G1 and G2 change states prior to the arrival of a transition in Data In. G2 is set low, and G1 is set high during the time they are "active". While G1 and G2 are active, the blocking CMOS M1,M2 and M3,M4 are turned off and thus create the equivalent of an open switch, preventing data signals D and $\overline{D}$ from passing through. The voltage level at the output of the blocking CMOS, at nodes P1 and P2, is determined by the biasing transistors M5,M6,M7 during the time the blocking CMOS are off.

The operation of the biasing transistors M5,M6,M7 will now be described. As noted above, the gates of PMOS M6 and M7 are connected to node N2, to which the control signal G2 is applied. The gate of NMOS M5 is connected to node N1, to which control signal G1 is applied. The drains of PMOS devices M6 and M7 are connected to a ground terminal, while the source terminals of these devices are connected to nodes P1 and P2, respectively. The source and drain of NMOS M5 also are connected to nodes P1 and P2.

When controls signals G1 and G2 are active, biasing transistors M5,M6,M7 are turned "on", i.e., current flow occurs between source and drain. While these transistors are on, the voltage levels of signal PUG at node P1, and of signal PDG at node P2, are set to a bias point that is between $V_{cc}$ and ground levels. The bias point is determined by the threshold voltage and the source-to-bulk voltage $V_{SB}$ of PMOS M6 and M7.

Figure 6:
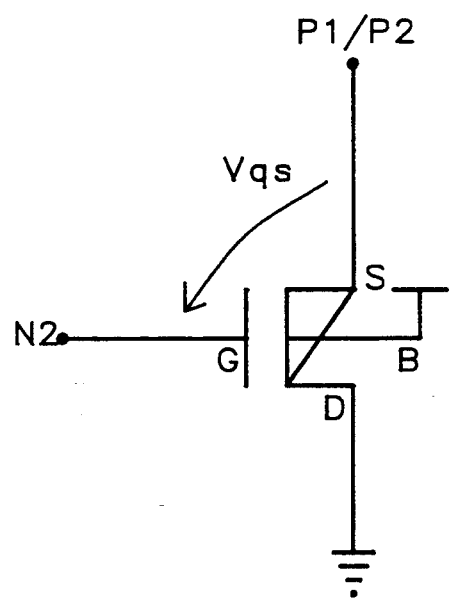
FIG. 6 is a schematic drawing of a PMOS transistor used in the circuit of the invention and its associated nodes.

The physical operation of transistors M6 and M7 will now be described, to explain why the nodes Pi and P2 preset to an intermediate voltage and do not go to a ground level. Referring to FIG. 6, representing PMOS devices M6 or M7, the gate-to-source voltage $V_{GS}$ must be greater than the threshold voltage $V_T$ to turn on the device. Since the gate voltage (at node N2) of M6 and M7 are at ground while the G2 signal is low, $V_S$ must be higher than $V_T$.

Figure 7:
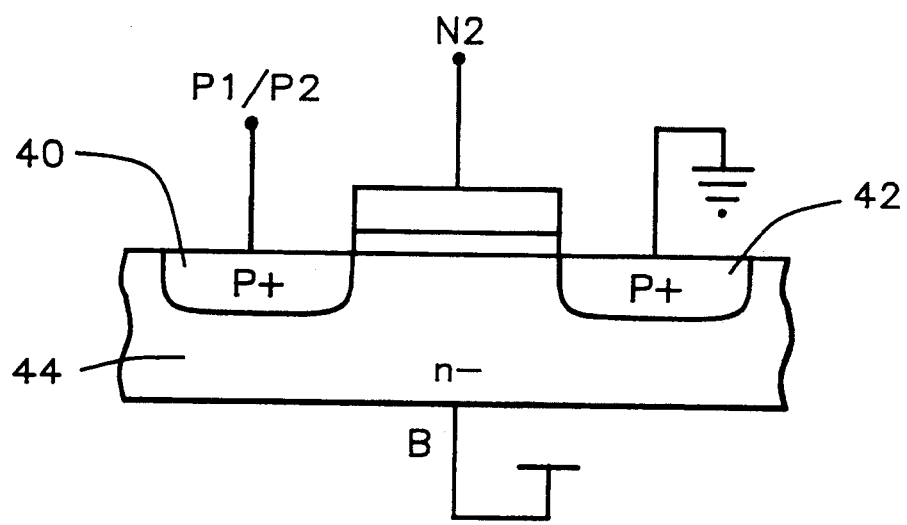
FIG. 7 is a cross-sectional representation of the PMOS transistor of FIG. 6 and its associated nodes.

The threshold voltage is determined by the equation:

$$V_T' = V_T + \gamma \sqrt{|V_{SB}|}$$

where $V_T$ is the normal threshold voltage, $\gamma$ is the body effect coefficient, and $V_{SB}$ is the source-to-bulk voltage. Referring to FIG. 7, in a PMOS device, the bulk (or substrate) is connected to a voltage set at $V_{cc}$ to create reverse-biased P-N junctions from the source region 40 to bulk 44, and from the drain region 42 to bulk. Since $V_B$ is set at $V_{cc}$, and $V_S$ is at an intermediate voltage level between ground and $V_{cc}$, there is a voltage difference $V_{SB}$ that would increase $V_T'$ based on the equation above.

The value of $\gamma$ is based on the equations $$\gamma = \sqrt{2q\epsilon_{si}\epsilon_o N_{sub}} / C_{ox}, \quad C_{ox} = \epsilon_{ox}\epsilon_o / T_{ox}$$

and therefore $$\gamma = \sqrt{2q\epsilon_{si}\epsilon_o N_{sub}} \cdot T_{ox}/\epsilon_{ox}\epsilon_o$$

where
  $\epsilon_{si}$ = dielectric constant of silicon = 11.7
  $\epsilon_{ox}$ = dielectric constant of oxide = 3.9
  $\epsilon_o$ = permittivity of free space = $8.85 \times 10^{-14}$ F/cm
  $N_{sub}$ = substrate dopant concentration
  $T_{ox}$ = gate oxide thickness
Therefore, $\gamma$ is proportional to $\sqrt{N_{sub}}$ and $T_{ox}$. The substrate concentration $N_{sub}$ is between about $1 \times 10^{12}$ and $1 \times 10^{13}$, and the gate oxide thickness $T_{ox}$ is between about 200 and 250 Angstroms. In the output buffer of the invention, this leads to a threshold voltage $V_T'$ of between about 0.7 and 0.9 volts. This leads to the bias level of $V_S$ being set at between about 1.3 and 1.5 volts as can be seen in the waveform for signals PUG and PDG in FIG. 5. NMOS M5 simply equalizes the voltages at nodes P1 and P2.

The signals PUG and PDG thus are set at a voltage level of 1.3 to 1.5 volts for the time during which the control signals G1 and G2 are active, as can be seen in FIG. 5. This voltage level at the gate terminals of pull-up device M8 and pull-down device M9 causes the output voltage of these devices, at output node P3, to set at approximately $\frac{1}{2}$ of $V_{cc}$, as shown in the Data Out waveform of FIG. 5.

A transition at Data In now occurs, and is propagated through to Data Out once control signals G1 and G2 return to their inactive state (G1 low and G2 high), The release of the control signals allow the data signal to pass through blocking CMOS M1,M2 and M3,M4. The control signals inactive state also turns off transistors M5, M6 and M7, therefore allowing the signals PUG and PDG to be determined by the data signal passing through the blocking CMOS. Finally, transition of signals PUG and PDG causes the Data Out signal to move from its voltage level at approximately $\frac{1}{2}$ of $V_{cc}$ to the new level that is the same as Data In. The reduced voltage swing at Data Out from the prior art output buffer results in a higher speed buffer, and reduced electrical noise, as discussed earlier.

The advanced output buffer circuit of the invention could be used in other applications besides the SRAM described herein, particularly with a DRAM (Dynamic RAM). Further, any high speed integrated circuit, such as a microcontroller, CPU (Computer Processing Unit), ROM (Read Only Memory), etc., which requires a high-performance output buffer can use the circuit of the invention.

While the invention has been particularly shown and described with reference to the preferred embodiments thereof, it will be understood by those skilled in the art that various changes in form and details may be made without departing from the spirit and scope of the invention.

What is claimed is:

1. An output buffer circuit with a reduced voltage swing at its output terminal in response to control signals and a data signal on its input terminal, comprising:
   a first inverter stage with its input being the input terminal at which is applied said data signal, for delaying said data signal;
   a second inverter stage with its input being the input terminal at which is applied said data signal, providing an inverted data signal at its output;
   means, responsive to said control signals, for blocking said data signal and said inverted data signal;
   means, responsive to said control signals, for biasing a first and second output node to a first intermediate voltage level, said first and second output nodes being connected to outputs of said blocking means;
   means, with its inputs connected to said first and second output nodes, for generating a second intermediate voltage level at said output terminal in response to said first intermediate voltage level during said blocking of said data signal, wherein said generating means provides said data signal at said output terminal when said blocking means allow said data signal to pass through.

2. The circuit of claim 1 wherein said first inverter stage comprises:
   a first inverter with its input connected to said input terminal, and its output connected to a second inverter; and
   said second inverter has its output connected to a first input of said blocking means.

3. The circuit of claim 2 wherein said second inverter stage is a single inverter with its input being the input terminal at which is applied said data signal, and with its output connected to a second input of said blocking means.

4. The circuit of claim 3 wherein said control signals are applied at first and second control nodes, with said control signal at said second control node having an inverse voltage level of said control signal at said first control node.

5. The circuit of claim 4 wherein said blocking means comprises:
   a first CMOS FET having its input connected to the output of said first inverter stage, its output connected to said first output node, its first gate terminal connected to aid first control node and its second gate terminal connected to said second control node; and
   a second CMOS FET having its input connected to the output of said second inverter stage, its output connected to said second output node, its first gate terminal connected to said second control node and its second gate terminal connected to said first control node.

6. The circuit of claim 5 wherein said biasing means comprises a first FET, second FET and third FET.

7. The circuit of claim 6 wherein said first FET has its gate terminal connected to said second control node, its drain terminal connected to a ground terminal, and its source terminal connected to said first output node.

8. The circuit of claim 6 wherein said second FET has its gate terminal connected to said first control node, its first source/drain terminal connected to said first output node, and its other source/drain terminal connected to said second output node.

9. The circuit of claim 6 wherein said third FET has its gate terminal connected to said second control node, its drain terminal connected to a ground terminal, and its source terminal connected to said second output node.

10. The circuit of claim 6 wherein said generating means comprises a fourth FET and a fifth FET.

11. The circuit of claim 10 wherein said fourth FET is a pullup transistor having its gate terminal connected to said first output node, its first source/drain terminal connected to a voltage terminal and its other source/drain terminal connected to said output terminal.

12. The circuit of claim 10 wherein said fifth FET is a pulldown transistor having its gate terminal connected to said second output node, its first source/drain terminal connected to a ground terminal and its other source/drain terminal connected to said output terminal.

* * * * *